United States Patent [19]

Jerome et al.

[11] Patent Number: 5,344,785

[45] Date of Patent: Sep. 6, 1994

[54] METHOD OF FORMING HIGH SPEED, HIGH VOLTAGE FULLY ISOLATED BIPOLAR TRANSISTORS ON A SOI SUBSTRATE

[75] Inventors: Rick C. Jerome, Monument; Diane R. Williams; Kurt D. Humphrey, both of Colorado Springs, all of Colo.

[73] Assignee: United Technologies Corporation, Hartford, Conn.

[21] Appl. No.: 72,653

[22] Filed: Jun. 3, 1993

Related U.S. Application Data

[63] Continuation-in-part of Ser. No. 850,612, Mar. 13, 1992, abandoned, which is a continuation of Ser. No. 673,817, Mar. 22, 1991, abandoned.

[51] Int. Cl.[5] .................................. H01L 21/265
[52] U.S. Cl. ........................................ 437/31; 437/55; 437/61; 437/62; 148/DIG. 85; 148/DIG. 150
[58] Field of Search ............... 437/31, 67, 64, 62, 437/55, 59, 60, 918, 919; 148/DIG. 85, DIG. 86, DIG. 117, DIG. 150

[56] References Cited

U.S. PATENT DOCUMENTS

| | | | |
|---|---|---|---|
| 4,631,803 | 12/1986 | Hunter et al. | 148/DIG. 117 |
| 4,685,199 | 8/1987 | Jastrzebski | 437/54 |
| 4,690,729 | 9/1987 | Douglas | 156/643 |
| 4,751,561 | 6/1988 | Jastrzebski | 357/44 |
| 4,810,667 | 3/1989 | Zorinsky et al. | 437/62 |
| 4,835,115 | 5/1989 | Eklund | 437/38 |
| 4,851,078 | 7/1989 | Short et al. | 156/632 |
| 4,851,366 | 7/1989 | Blanchard | 437/61 |
| 4,897,703 | 1/1990 | Spratt et al. | 357/34 |
| 4,900,689 | 2/1990 | Bajor et al. | 437/31 |
| 4,916,511 | 4/1990 | Douglas | 357/23.6 |
| 4,939,099 | 7/1990 | Seacrist et al. | 437/31 |
| 4,951,102 | 8/1990 | Beitman et al. | 357/23.4 |
| 4,963,505 | 10/1990 | Fuji et al. | 437/62 |
| 4,965,213 | 10/1990 | Blake | 437/21 |
| 4,984,039 | 1/1991 | Douglas | 357/236 |
| 4,985,744 | 1/1991 | Spratt et al. | 357/43 |
| 4,990,991 | 2/1991 | Ikeda et al. | 357/34 |
| 5,010,378 | 4/1991 | Douglas | 357/23.6 |
| 5,028,557 | 7/1991 | Tsai et al. | 437/59 |
| 5,032,529 | 7/1991 | Beitman et al. | 437/21 |
| 5,036,021 | 7/1991 | Goto | 437/62 |
| 5,049,513 | 9/1991 | Eklund | 437/34 |
| 5,057,895 | 10/1991 | Beasom | 357/49 |
| 5,070,388 | 12/1991 | Wade et al. | 357/68 |
| 5,086,011 | 2/1992 | Shiota | 437/61 |
| 5,087,580 | 2/1992 | Eklund | 437/41 |
| 5,110,749 | 5/1992 | Ikeda | 437/31 |

FOREIGN PATENT DOCUMENTS 0081438  3/1990  Japan ........................... 437/62

*Primary Examiner*—Tom Thomas
*Assistant Examiner*—Tuan Nguyen

[57] ABSTRACT

A method of manufacturing various types of silicon devices, such as complementary bipolar PNP and NPN transistors, in a Silicon On Insulator ("SOI") Integrated Circuit ("IC"), the SOI IC having a substrate, a buried insulating layer disposed above the substrate, and a silicon device layer disposed above the insulating layer. Vertical transistors may be formed in the device layer such that each transistor is fully dielectrically isolated from another and also from other similarly manufactured silicon devices in the silicon device layer.

20 Claims, 8 Drawing Sheets

METHOD OF FORMING HIGH SPEED, HIGH VOLTAGE FULLY ISOLATED BIPOLAR TRANSISTORS ON A SOI SUBSTRATE

This is a file wrapper continuation in part application of a prior application having a Ser. No. 07/850,612, filed on Mar. 13, 1992, now abandoned, which is a continuation of application Ser. No. 07/673,817, filed Mar. 22, 1991 (abandoned).

TECHNICAL FIELD

The invention relates to devices such as vertical complementary NPN and PNP bipolar transistors formed in a layer of silicon deposited on an SOI substrate, and more particularly, to a process for achieving full dielectric isolation between such devices formed in the silicon layer deposited on the SOI substrate. The bipolar devices have both high switching speed and high $BV_{CEO}$, making them highly suitable for analog circuits. The process technology includes fabrication of high precision, laser trimmable thin film resistors, precision capacitors, and two layers of interconnect metal.

BACKGROUND ART

It is known to make bipolar analog circuits that are capable of sustaining a voltage of about 40 volts. Such prior art circuits have a drawback in that they are slow to switch and consume a large amount of area per transistor.

Prior art complementary bipolar technologies in bulk silicon use one of the following processes in order to isolate transistors: PN junction isolation; LOCOS (Local Oxidation of Silicon) isolation; or trench isolation. Since all of these are in bulk material they are all subject to parasitic interaction with the substrate. One dielectrically isolated technology uses an anisotropic etch of a <100> silicon crystal. The etched surface is oxidized and deposited with a thick layer of polysilicon to form islands of single crystal silicon. After this process, the wafer is inverted, polished and etched back to expose the silicon islands in which the transistors are formed. Problems associated with this technology are grind and etch-back non-uniformity, limited wafer diameter, large device size, device size dependent on isolation depths, and high parasitic AC impedance with polysilicon substrates.

DISCLOSURE OF INVENTION

Objects of the invention include the provision of an integrated circuit manufacturing process capable of achieving full dielectric isolation between devices, such as vertical NPN and PNP bipolar transistors, formed in a layer of silicon deposited on an SOI substrate.

According to the present invention, a process of manufacturing bipolar analog devices on an SOI substrate includes the steps of implanting N and P doped buried conductor regions in the SOI silicon layer. Formed above the buried conductors is an epitaxial silicon layer which may have a predetermined dopant concentration and polarity. An N doped low resistance path between the surface of the epi layer and implanted N doped buried conductor, and a P doped low resistance path between the surface of the epi layer and implanted P doped buried conductor are formed. A well is formed in the epi layer, the well being disposed above the implanted P doped buried conductor, the well being of a doping polarity opposite that of the polarity of the epi layer. If undoped epi is used, both n-type and p-type wells are implanted therein, each well being of the same conductivity as that of the corresponding buried conductor. Next, a plurality of trenches are cut from the surface of the epi layer down to the buried insulating layer, one trench being disposed between the well and epi layer so as to fully dielectrically isolate the p-type well from the n-type epi layer, the remaining trenches being disposed between either the well or the epi layer and other similarly manufactured bipolar transistors or other silicon devices. Vertical transistors may be formed in the well and epi layer by implanting base regions of polarity opposite that of the well and epi layer, and by forming emitter regions enclosed by base regions, the emitters comprising a layer of polycrystalline silicon deposited on a surface of the base region and a diffusion area in that portion of the base region below the poly layer.

The invention relates to an improved process for forming high voltage bipolar integrated circuits, in which resistance to high reverse collector - emitter bias voltage is combined with fast switching speed and high frequency performance. This is accomplished by providing dielectrically refilled trenches which are etched through the epitaxial surface silicon down to the buried oxide layer, achieving complete isolation between adjacent devices. Also, the epitaxial layer thickness and resistivity are optimized for high voltage applications and a manufacturable trench aspect ratio.

Features of the invention include the use of a thin device layer of single crystal silicon above a buried insulator layer, and the use of shallow polysilicon emitters to achieve less peripheral emitter - base junction capacitance, less charge storage, faster speed, greater radiation tolerance, and reduced collector-base junction depth. Also provided are high precision thin film resistors and capacitors and double level metal for ease of routing within an analog circuit and improved packing density. Through the use of shallow polysilicon emitters, the epi layer is made thick enough to provide high $BV_{CEO}$, but is also thin enough for relatively high speed switching and relatively shallow trench depth, relative to prior art linear process technologies..

Further features of the method include the provision of different types of devices by means of the addition of a relatively small number of steps.

These and other objects, features and advantages of the present invention will become more apparent in light of the detailed description of a best mode embodiment thereof, as illustrated in the accompanying drawings.

BEST MODE FOR CARRYING OUT THE INVENTION

Figure 1:
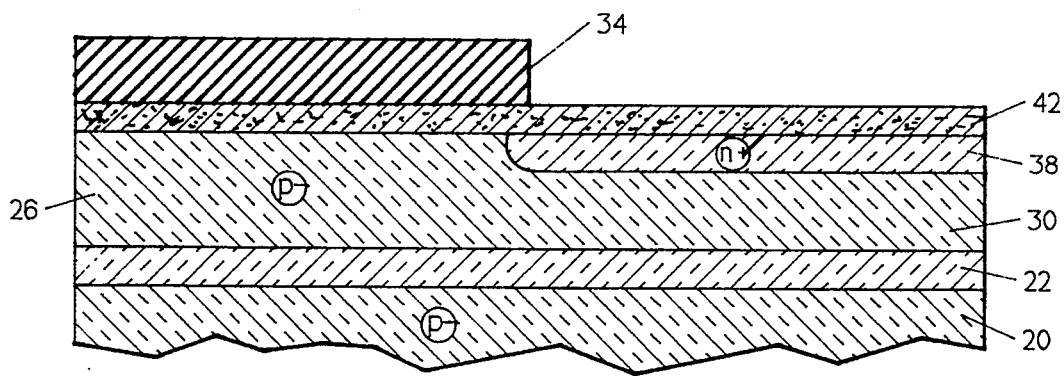
FIGS. 1 through 16 are cross sectional views of an integrated circuit device fabricated according to the method of the present invention at various stages in the method.

FIG. 1 is a cross sectional view of a portion of a commercially available Silicon On Insulator ("SOI") substrate 20. As described in more detail hereinafter with respect to the figures, the substrate 20 has disposed thereon a buried oxide layer and a silicon device layer. The silicon device layer may have known silicon devices, e.g., complementary vertical bipolar PNP and NPN transistors as illustrated in FIG. 1, formed therein in accordance with the method of the present invention. However, it is to be understood that other transistors and/or other known silicon devices (e.g., (1) diffused base resistors, (2) epi layer resistors, (3) p-n junction diodes, etc.) may be formed in the device layer by one of ordinary skill in the art in light of the teachings herein.

The steps of the present invention related to construction of vertical PNP and NPN transistors in the device layer are illustrated in sequence in FIGS. 1–16. Each figure illustrates the results of one or more steps in the method of the present invention, thereby reducing the number of figures in the drawing. Conventional steps such as depositing and patterning photoresist are ordinarily not illustrated.

A bulk substrate 20 is provided comprising silicon and oriented in the conventional <100> orientation and doped, e.g., P−. However, the substrate 20 may be doped N− or N+, if desired. Above the substrate is a layer 22 of insulating material, conventionally silicon dioxide, having a nominal thickness of, e g., 10 microns.

Layers disposed above the insulating layer 22, collectively referred to as the device layer 26, comprise layers of silicon of appropriate doping in which various devices described herein without limitation are formed, such as, e.g., vertical NPN and PNP transistors. Thus, the term "Silicon On Insulator". The invention may be utilized with various types of SOI substrates. For example, a known SIMOX ("Separation of Silicon by Implantation of Oxygen") substrate may be used. However, the more modern BESOI ("Bonded and Etchback Silicon On Insulator") substrates may also be used. The BESOI substrates have significantly lower defect densities than currently available SIMOX material. Both buried oxide and superficial silicon is thicker on BESOI than on SIMOX. Thicker buried oxide is required for lower capacitance and higher substrate breakdown voltage. Thicker silicon is required for formation of buried layers of low resistivity.

Layer 30 is the lowest portion of device layer 26. Layer 30 has the same <100> orientation and typically the same doping as the substrate 20, and is nominally 2 microns thick. The layer 30 comprises silicon remaining from the bond and etchback process used to fabricate the BESOI substrate. Since, for this exemplary embodiment, the substrate is doped P−, then layer 30 may be doped P− or N−, but not N+ or P+. The left side of the top of the device is covered by a layer of photoresist 34. The photoresist permits the selective implantation of a buried layer 38, doped N+, into the layer 30. An implant screen oxide 42 of conventional thickness (e.g., 225 Angstroms) is formed above the entire device.

Figure 2:
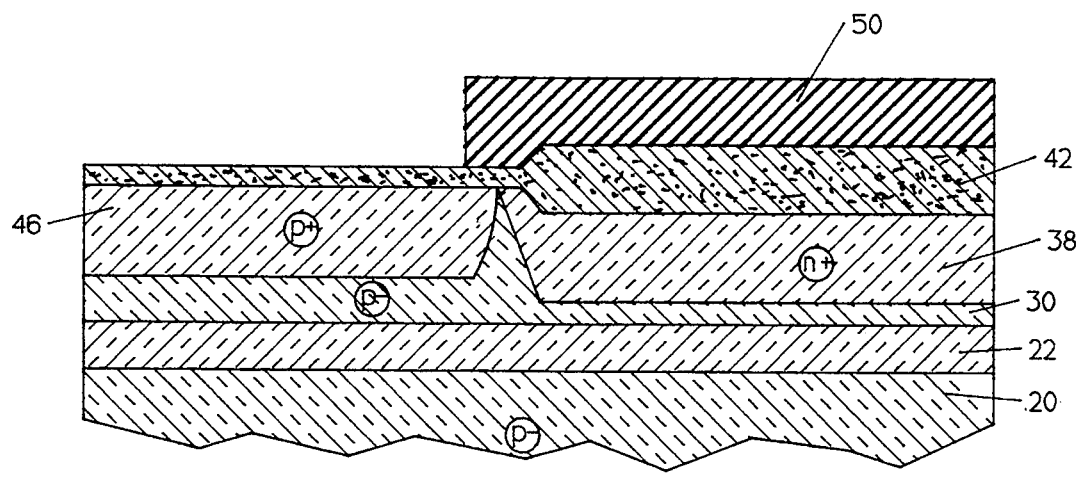

In FIG. 2, several steps in implanting a P+ buried semiconductor layer are illustrated. A low temperature steam differential oxidation of the right hand portion of the oxide layer 42 above the N+ buried layer 38 is carried out. This provides an increased thickness (e.g., 0.44 microns) of oxide 42 above the N+ buried layer 38, whereas the thickness of the oxide above a P+ layer 46 is, e.g., 0.22 microns. The oxide 42 masks a P+ implant that forms P+ doped buried semiconductor layer 46 and creates a step for subsequent layer alignment. Further illustrated is a layer 50 of photoresist disposed above the right hand portion of the oxide layer 42 which facilitates the P+ implant. The resist illustrated is optional to separate buried layers. The low temperature oxidation process facilitates a self-aligned buried layer.

Figure 3:
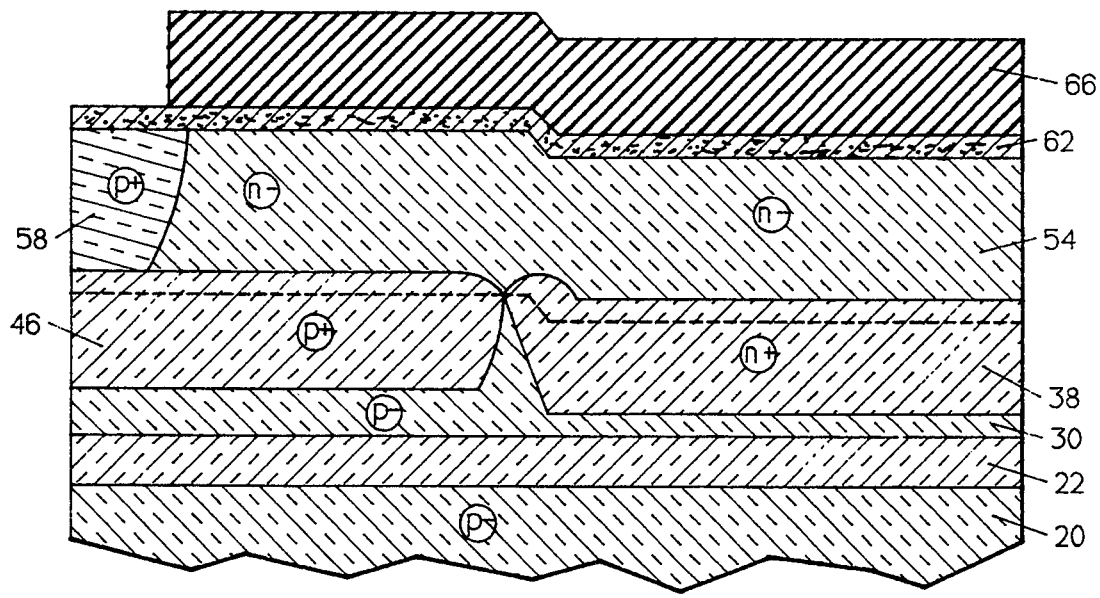

In FIG. 3, both the P+ and N+ buried layers 38,46 are annealed. An epitaxial single crystal layer 54, doped, e.g., N−, is put down by, e.g., a conventional epitaxial deposition process. The epi layer 54 permits the formation of wells holding, e.g., vertical transistors described hereinafter. That is, the left side of the epi layer 54 will form a collector for a PNP transistor (following the formation of a P well). The right side of the epi layer will form a collector for an NPN transistor. The epi layer thickness should be about 2–7 microns, preferably 3.5–5 microns. Tests results show an epi layer thickness of 4.5 microns provides the desired high break down voltage $BV_{CEO}$ (e.g., 32–48 volts) and high Early Voltage $V_a$ (e.g., $V_a > 60$ volts for an npn device and $V_a > 80$ volts for a pnp device). In general, the epi layer thickness depends upon the desired reverse bias voltage and the desired depletion depth of the bipolar transistor collector-base junction. The epi layer may have a predetermined dopant concentration and polarity. If undoped epi is instead used, both n-type and p-type wells are implanted therein, each well being of the same conductivity as that of the corresponding buried conductor.

A low resistance path 58 to the P+ buried layer 46 is formed to the left of the epi layer 54. The path 58 is doped P+ and referred to conventionally as a sink. The dotted line in FIG. 3 illustrates the position of the device surface before the deposition of the epi layer 54. A protective oxide 62 is formed by thermal oxidation over the epi layer 54. Also illustrated is a layer 66 of photoresist which masks the upper surface of the device to facilitate the formation of the sink 58.

Figure 4:
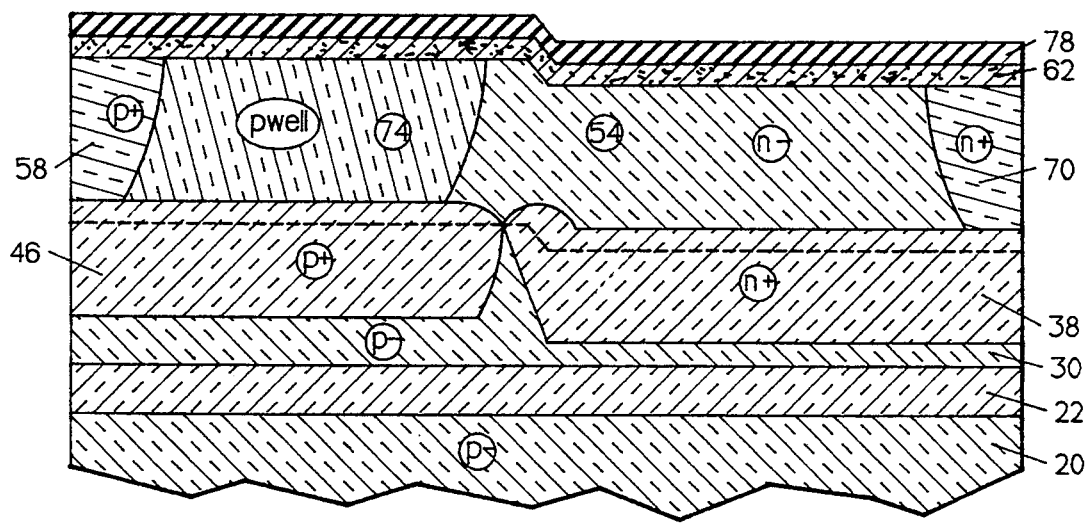

In FIG. 4 is illustrated a corresponding N+ sink 70 formed on the right side of the N− epi layer 54. The sinks 58,70 provide for contact from the device surface area down to the N+ and P+ buried conductors 38,46. A P well 74 is then formed in the left side of the epi layer 54 by conventional implant techniques using, e.g., boron, as the impurity. The sinks 58,70 and the P well 74 are then diffused.

Next, a protective nitride layer 78 is formed above the oxide layer 62. The nitride layer 78 is later used as the masking nitride for a non-recessed LOCOS layer. The terms oxide and nitride are used for several layers of the device as they are conventionally stripped and redeposited as required in a conventional manner.

Figure 5:
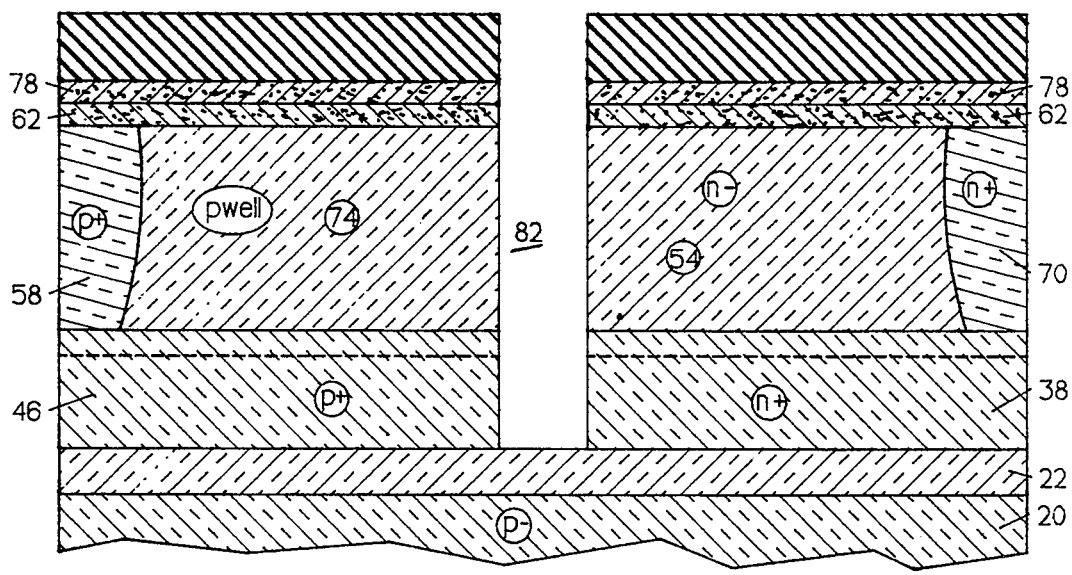

In FIG. 5, isolation between the P well 74 and the N− region of the epi layer 54 is accomplished by a trench 82. The trench 82 is etched through nitride 78, oxide 62, N− epi layer 54, and both buried conductors 38,46 down to the insulating layer 22. Although not illustrated in FIG. 5, similar trenches are provided to the left hand side of the P+ sink 58 and P+ buried layer 46, and on the right hand side of the N+ sink 70 and N+ buried layer 38. Such side trenches isolate the transistors from other silicon devices, such as, without limitation, other complementary transistors, formed on the SOI substrate in a similar manner in accordance with the present invention. The side trenches appear in the figures beginning with FIG. 8.

The trench 82 has a total depth of, e.g., 5–6 microns and an aspect ratio of nominally less than 3:1. The trench provides higher device density circuits more reliably because of the reduced transistor - transistor spacing. This is beneficial compared to prior art isolation techniques such as a LOCOS isolation or junction isolation which have a wider transistor - transistor spacing. Trench isolation, as is known, provides superior isolation of the adjacent wells.

Figure 6:
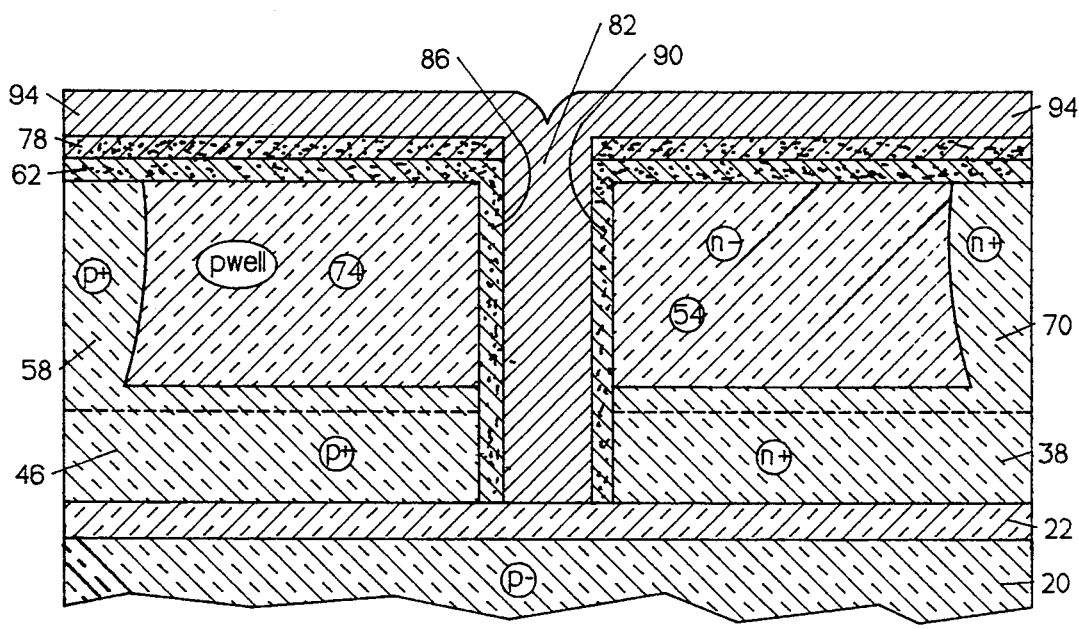

In FIG. 6, the trench 82 is illustrated as being filled by thermally grown oxide forming two oxide sidewalls 86,90 on the sides of the P well 74 and N— region 54, and also forming a deposited oxide layer 94 above the nitride layer 78. The oxide comprises a TEOS ("Tetra Ethyl Ortho Silicate") deposited, e.g., by one of two methods. The first method of trench refill comprises an initial sidewall liner refill and then a refill of the remaining space with TEOS. The second trench refill method comprises the initial sidewall liner refill, a TEOS refill of less than the complete void, and a final complete refill of polysilicon.

Figure 7:
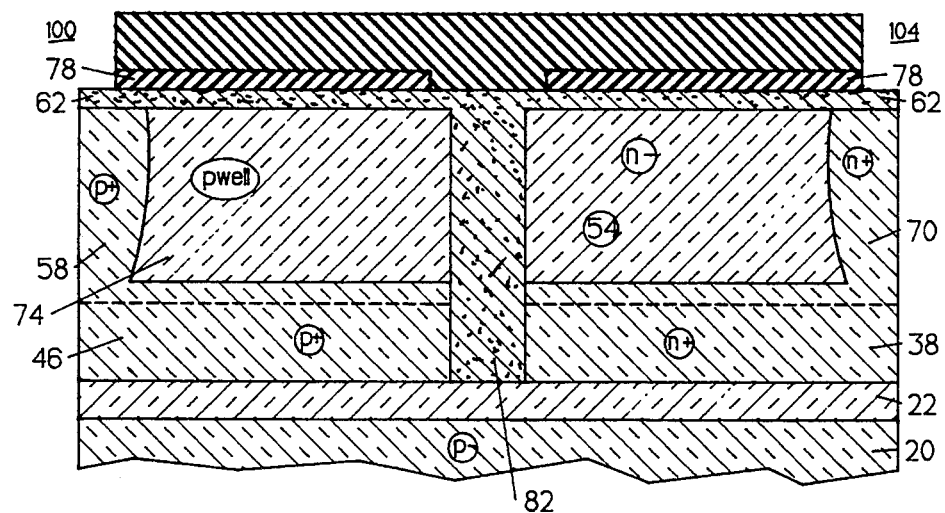

In FIG. 7, the oxide layer 94 has been etched in a planarization step and a-small portion of the nitride layer 78 has been etched away in areas 100,104 on each side. This permits the growth of LOCOS caps above middle trench 82 and side trenches 110,114 and also forms conventional field oxide regions (not shown).

Figure 8:
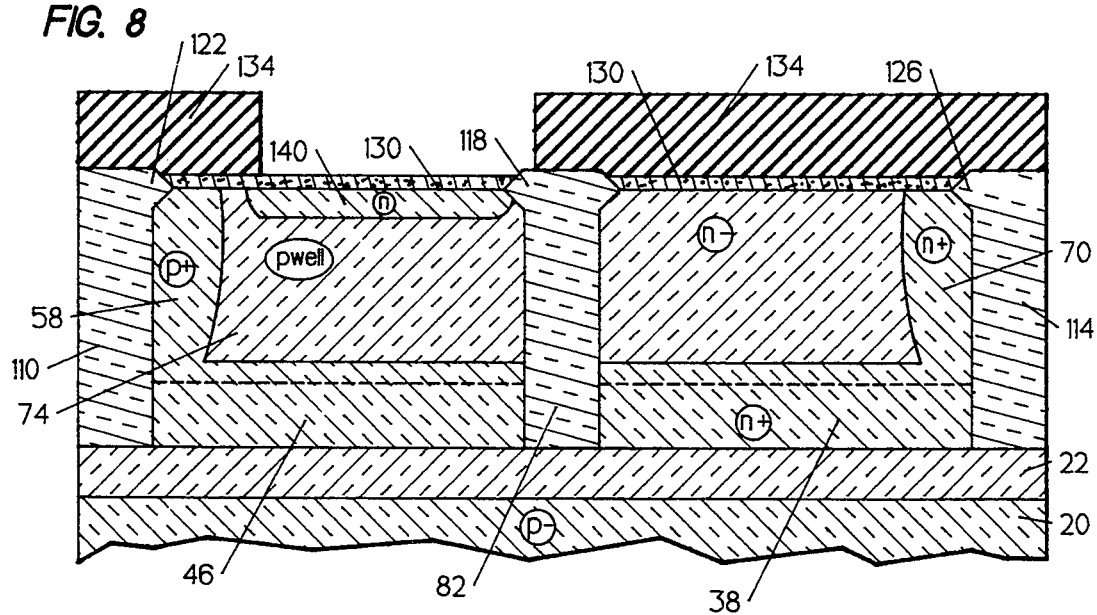

In FIG. 8, LOCOS caps 118,122,126 are grown on the middle trench 82 refill and on the side trench 110,114 refills, respectively. FIG. 8 serves to better illustrate the trench isolation of the complementary transistors from adjacent silicon devices (not shown), e.g., other complementary vertical transistors. Although not illustrated, corresponding trenches are also formed for further isolation behind and in front of the plane of the paper of FIG. 8. The oxide and nitride layers 62,78 have been stripped and replaced by a thin oxide layer 130. The layer 130 is referred to as a stress relief oxide and uses thermal oxidation to smooth out sharp corners. This layer 130 also serves as an implant screen oxide. Also illustrated are regions 134 of photoresist.

Figure 9:
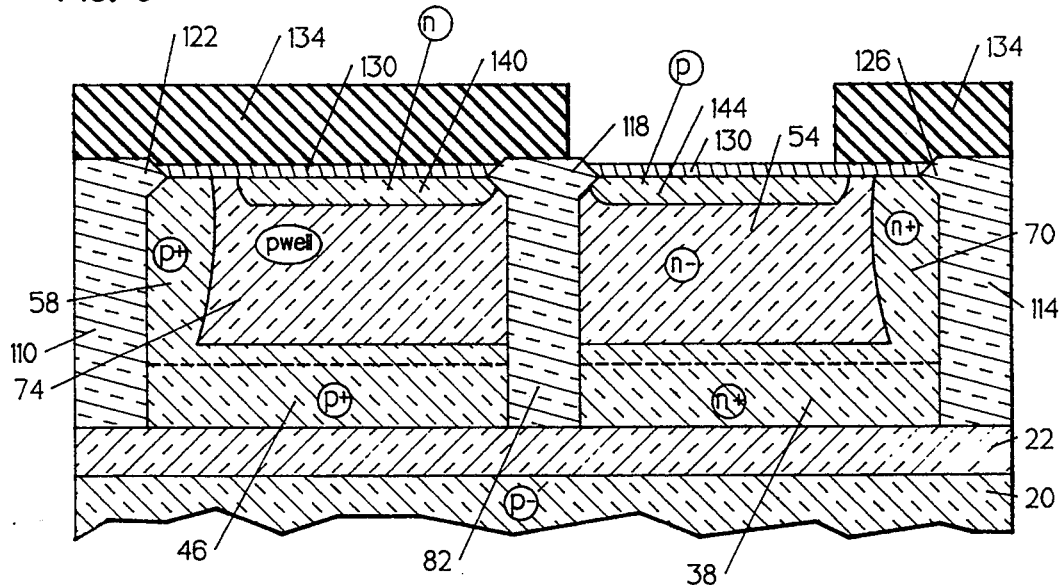

On the left side of FIG. 8 is illustrated the implantation of an N-type base region 140 of a vertical PNP transistor formed in-P well 74. In FIG. 9 is illustrated the corresponding implantation of a P-type base region 144 of a vertical NPN transistor formed in N epi layer 54.

Figure 10:
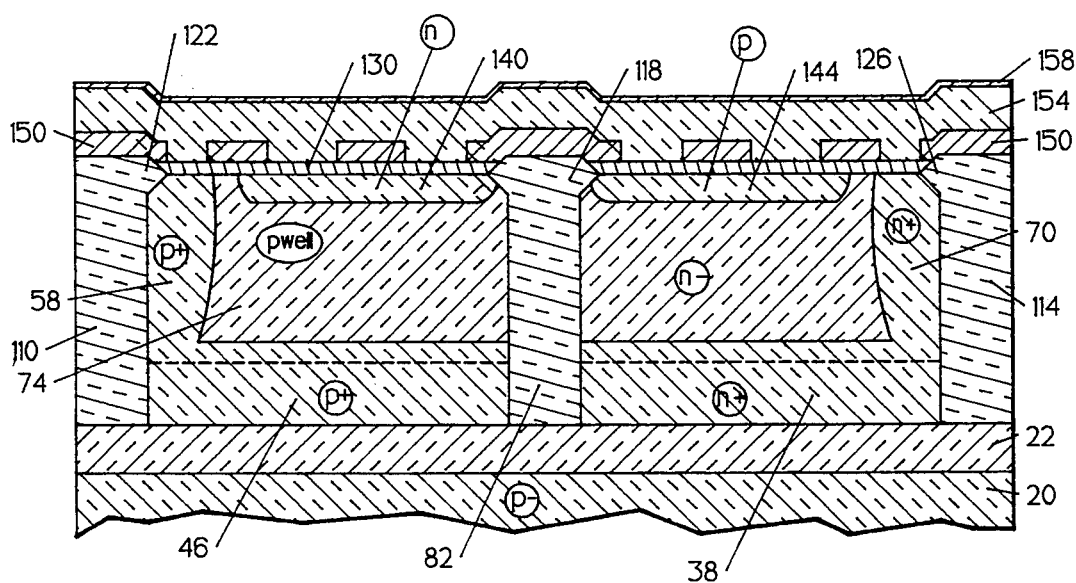

In FIG. 10, the next step is the deposition of an oxide layer 150, typically 1100 Angstroms thick, used to isolate the contacts to the various transistors. Above the oxide layer 150 is formed a polysilicon layer 154. A thin oxide layer 158 has been grown on top of poly layer 154 and etched to facilitate patterning of poly layer 154. At a convenient time in this process, an annealing step is performed in order to anneal out the implant damage to the bases 140,144 of the transistors.

Figure 11:
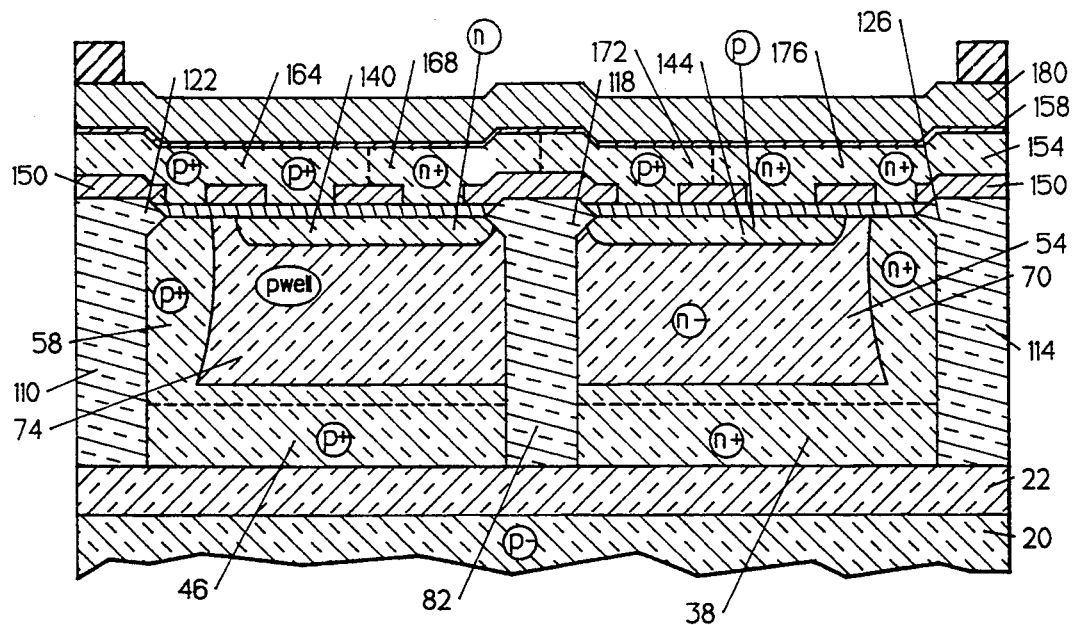

Referring to FIG. 11, poly layer 154 is doped in certain regions thereof at an appropriate polarity (i.e., either P+ or N+) for the contacts illustrated. For the vertical PNP transistor on the left, poly area 164 on the left is doped P+ and makes contact with the P+ sink 58 and the area in which the emitter for the PNP transistor will be formed. Poly area 168 on the right makes contact with the base 140 and is doped N+. For the vertical NPN transistor on the right, poly area 172 in contact with the base 144 of the NPN transistor is doped P+. Poly area 176 is doped N+ and is in contact with the N+ sink 70 and the area in which the emitter for the NPN transistor will be formed.

Above the thin oxide layer 158 is disposed a thicker LTO (Low Temperature Oxide deposition) oxide layer 180. An optional step of patterning poly layer 154 to form both N+ and P+ polysilicon resistors in areas outside that illustrated in FIG. 11 may be performed at this time.

Figure 12:
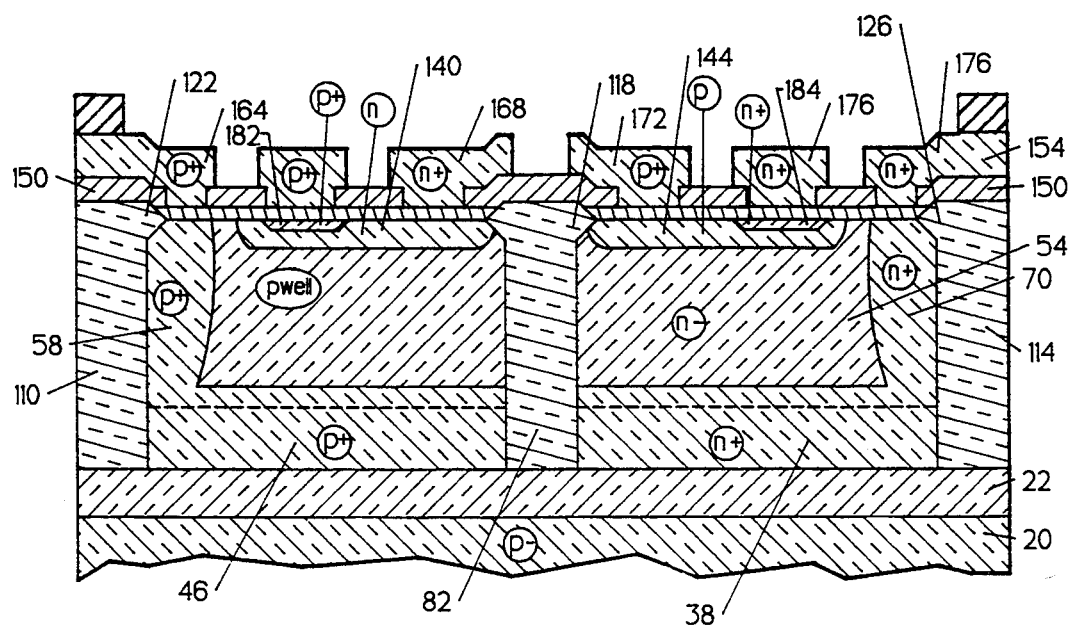

In FIG. 12, the LTO layer 180 has been etched to form protective pieces of silicon dioxide that will mask a silicidation process to be performed. This is followed by another etch to pattern poly layer 154, isolating the P+ and the N+ regions 164-176 to form polysilicon elements that will serve as sources for dopant diffusion and as contacts with the transistor elements.

An annealing step is performed that diffuses the N+ and P+ dopants from the poly elements 164-176 into the epitaxial layers 140,144 to form the emitters 182,184 of the transistors. An optional rapid thermal anneal ("RTA") step may be used to break up interfacial oxides and reduce emitter resistance critical to linear applications. Titanium is deposited on the exposed portions of poly layer 154 and an RTA step is performed to form TiSi$_2$ in a conventional silicide process.

The PNP and NPN transistors are now complete, with the doping for the emitters 182,184 in each case being provided by diffusion from the corresponding portion of the poly layer 154. This results in less diffusion and lower capacitance for the transistor. The N+ emitter 184 of the NPN transistor has a nominal depth of 0.10 microns. The P+ base 144 has a nominal depth of 0.30 microns. The N+ collector formed in the buried layer 38 has a nominal depth of 5.0 microns. The N+ sink 70 connects the N+ collector to the appropriate N+ contact formed in the poly layer 154.

Figure 13:
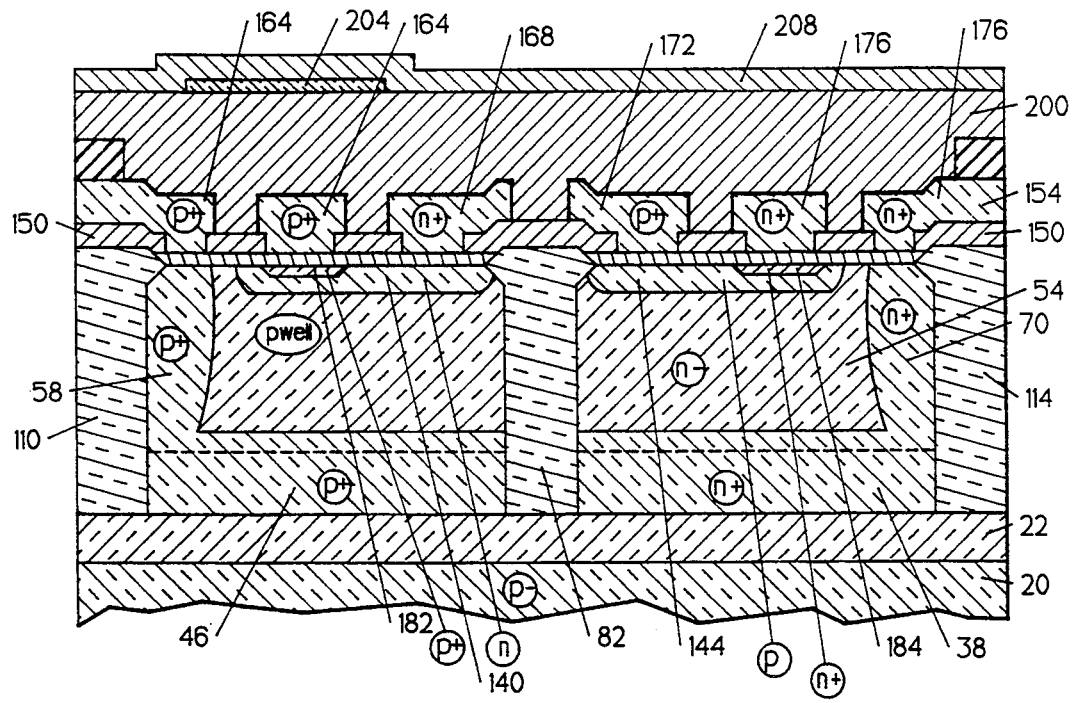

Referring to FIG. 13, additional steps which form the circuit interconnection layers are illustrated. An oxide layer 200 is deposited. Next, a SiCr thin film resistor 204 is deposited, aligned and etched. Then a layer 208 of LTO oxide is deposited.

Figure 14:
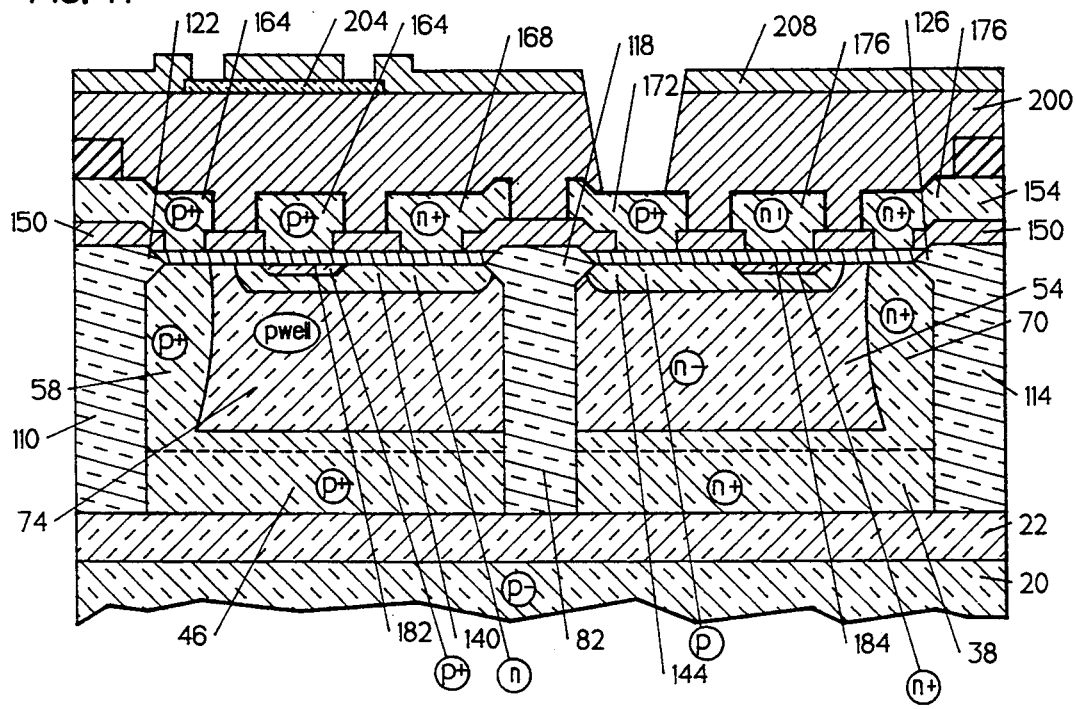

In FIG. 14, the contacts for the thin film resistors are aligned and etched. Next, the LTO oxide layer 208 and the oxide layer 200 are etched above the contact 172 for the P+ base 144. The etching is done down to the contact 172. This is an example of metal layer 1 contact to silicided poly. All device terminals will require such contact.

Figure 15:
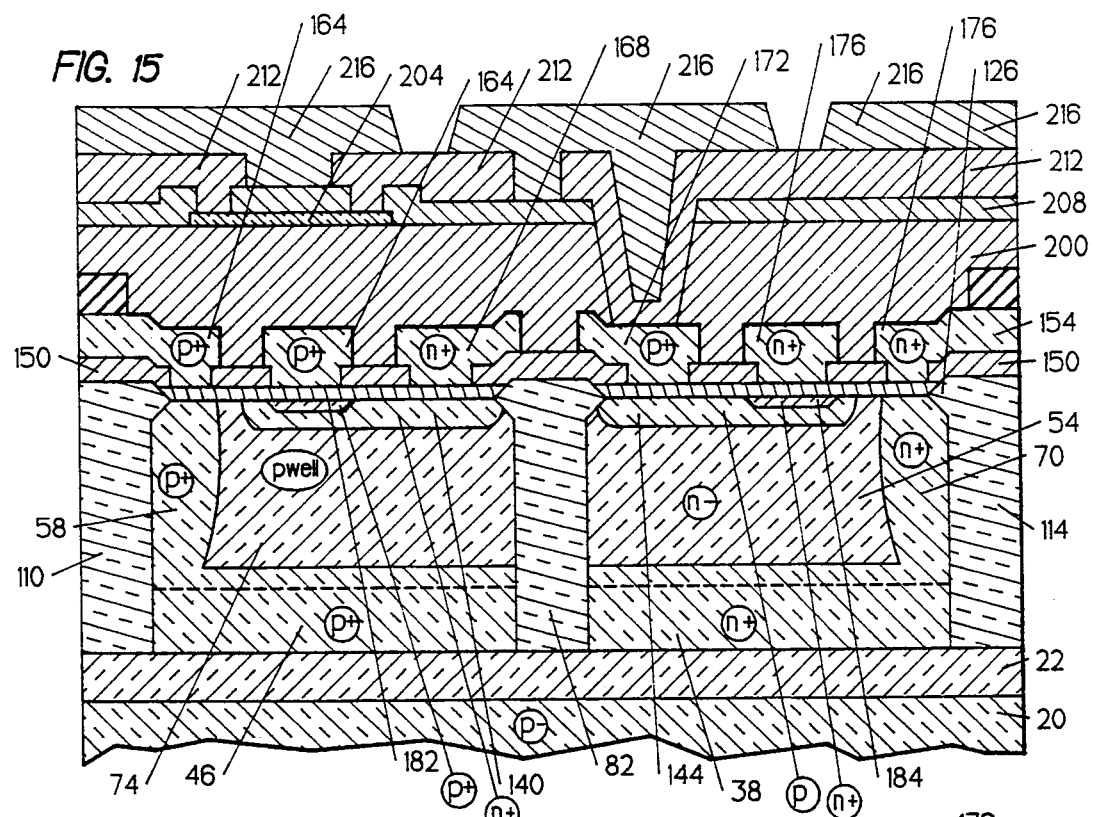

In FIG. 15, a first level metal layer 212 is deposited above the LTO layer 208. The metal 1 layer 212 is etched at appropriate points to provide the contacts for the thin film resistor 204, and P+ contact 172. A barrier metal comprised of ten percent (10%) titanium and ninety percent (90%) tungsten is deposited under the metal 1 level 212 to prevent Aluminum migration into the poly and to prevent copper poisoning of the SiCr resistors. The aluminum metallization contains approximately two percent (2%) copper to minimize failure due to electromigration. Next, another LTO layer 216 is deposited above the metal layer 212 and vias are etched into the LTO layer 216.

Figure 16:
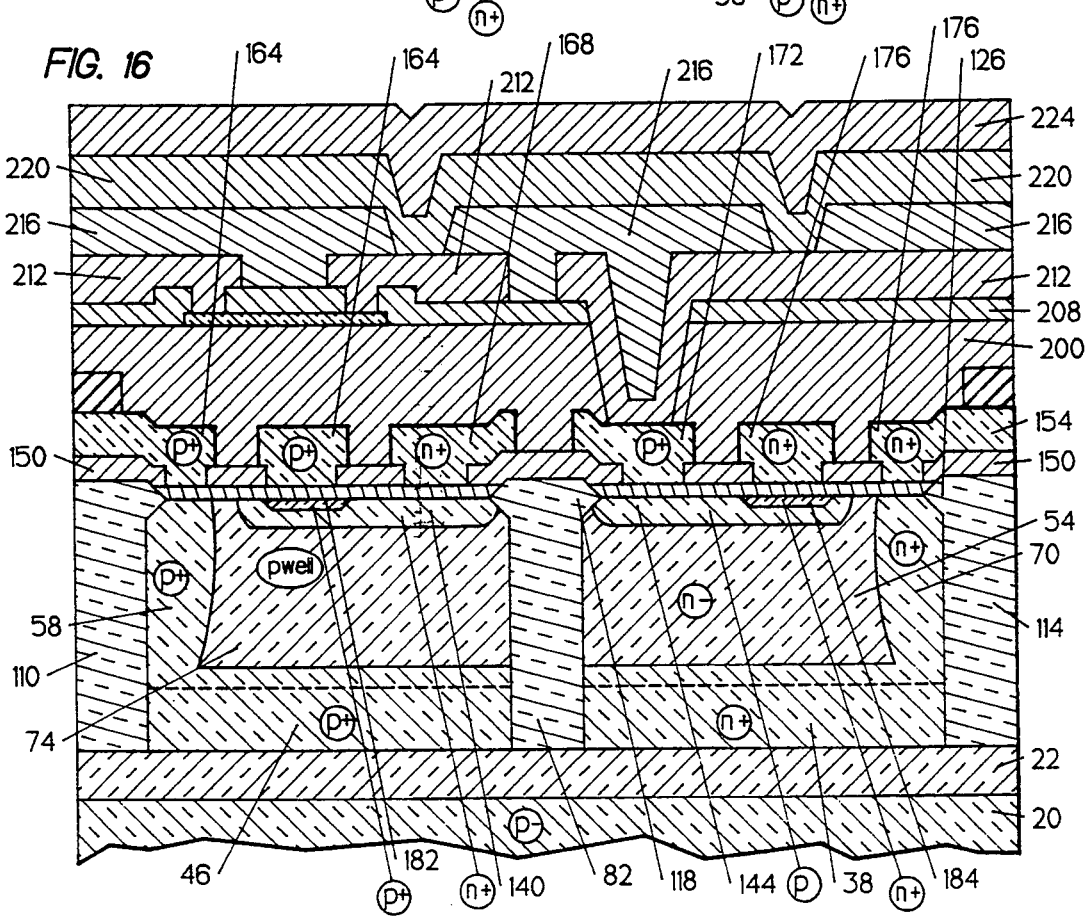

In FIG. 16, a second metal layer 220 is comprised of the same constituents as the metal 1 level 12, but without the need for the titanium - tungsten barrier metal. The metal 2 layer 220 is deposited and patterned to form upper connections. A passivation layer 224 of oxide and nitride is deposited and etched. Finally, an alloy step of, e.g., 30 minutes at 420°–450° C. is performed to reduce contact resistances.

From FIGS. 12-16 it is apparent to one of ordinary skill in the art that a precision capacitor has been formed by the method of the present invention. The lower plate of the capacitor comprises the N+ sink 70, the upper plate comprises N+ poly area 168, and the oxide 150 comprises the oxide of the capacitor. The particular oxide thickness directly relates to the value of the precision capacitor formed, approximately 0.3 femtofarads per square micron of oxide thickness. The thicker the oxide, the lower the value of the capacitor. The manufacturing processes of the present invention provides a device capable of high speed (fT 2–3 GHz for npn and pnp), high voltage ($BV_{CEO}$>40 volts for +/−15 volts rail-to-rail), and high early voltage. These operational characteristics are achieved do to shallow poly emitters (e.g., 0.1 microns), small device size, and the proper epi layer thickness of a device built according to the manufacturing processes of the present invention. In addition, trench isolation with SOI substrates reduces parasitic capacitances allowing for faster switching speed while eliminating latch-up in high voltage, high temperature or high radiation environments.

Although the invention has been illustrated and described with respect to a best mode embodiment thereof, it should be understood by those skilled in the art that the foregoing and various other changes, omissions, and additions in the form and detail thereof may be made without departing from the spirit and scope of the invention.

We claim:

1. A method of forming a complementary first and second transistor in a Silicon On Insulator ("SOI") Integrated Circuit ("IC"), the SOI IC having a substrate, a buried insulating layer superjacent the substrate, and a silicon device layer superjacent the buried insulating layer, the first and the second transistors formed in the silicon device layer such that the first transistor is dielectrically isolated from the second transistor, the method comprising the steps of:

implanting an N doped buried conductor region in the device layer;

implanting a P doped buried conductor region in the device layer;

forming an epitaxial silicon layer superjacent the device layer, said epitaxial layer having a thickness of at least 2 microns, said epitaxial silicon layer having a dopant polarity;

forming an N doped low resistance path between a surface of said epitaxial layer and said implanted N doped buried conductor region, and forming a P doped low resistance path between said surface of said epitaxial layer and said implanted P doped buried conductor region;

forming a well in a portion of said epitaxial layer, said well superjacent at least one of said implanted N doped buried conductor region and said implanted P doped buried conductor region, said well having a doping polarity opposite that of said epitaxial silicon layer;

forming a trench from said surface of said epitaxial layer down to the buried insulating layer, being disposed between said well and a remainder of said epitaxial layer so as to dielectrically isolate said well from said remainder of said epitaxial layer; and forming the first transistor in said well and the second transistor in said remainder of said epitaxial layer by implanting base regions in said well and in said remainder of said epitaxial layer of opposite polarities, and by forming emitter regions enclosed by said base regions.

2. The method of claim 1, further comprising the step of:

after said step of implanting an N doped buried conductor region in the device layer, forming a layer of implant screen oxide superjacent the device layer.

3. The method of claim 2, further comprising the step of:

before said step of implanting a P doped buried conductor region in the device layer, performing a low temperature steam differential oxidation of said layer of implant screen oxide superjacent said implanted N doped buried conductor region.

4. The method of claim 3, further comprising the step of:

before said step of forming, an epitaxial silicon layer superjacent the device layer, annealing said implanted N doped buried conductor region and said implanted P doped buried conductor region.

5. The method of claim 1, further comprising the step of:

before said step of forming an epitaxial silicon layer superjacent the device layer, annealing said implanted N doped buried conductor region and said implanted P doped buried conductor region.

6. The method of claim 1, further comprising the step of:

after said step of forming a well in said epitaxial layer, annealing said well, said N doped low resistance path, and said P doped low resistance path.

7. The method of claim 1, further comprising the step of:

filling with a first oxide.

8. The method of claim 7, wherein said step of filling said trench with a first oxide comprises the steps of:

filling a portion of the space in said trench along sidewalls of said trench with a second oxide; and filling the remaining space in said trench with a third oxide.

9. The method of claim 8, wherein at least one of said second and third oxides comprises tetra ethyl ortho silicate ("TEOS").

10. The method of claim 7, wherein said step of filling said trench with an oxide comprises the steps of:

filling a portion of the space in said trench along sidewalls of said trench with a second oxide;

filling a portion of the remaining space in said trench with third oxide; and filling the remaining space in said trench with a polysilicon.

11. The method of claim 10, wherein at least one of said second and third oxides comprises tetra ethyl ortho silicate ("TEOS").

12. The method of claim 7, wherein said first oxide comprises tetra ethyl ortho silicate ("TEOS").

13. The method of claim 7, further comprising the step of:

after said step of filling said trench with an oxide, forming a cap on said trench by local oxidation of silicon ("LOCOS").

14. The method of claim 1, wherein said step of forming emitter regions comprises the steps of:

depositing a layer of oxide on the surface of the IC abutting said base regions;

etching said oxide layer;

depositing a layer of polycrystalline silicon superjacent said oxide layer, said layer of polycrystalline silicon having regions of dopants;

annealing the IC to diffuse said dopants in said polycrystalline silicon layer into said base regions to form emitters; and forming titanium silicide on the surface of said polycrystalline silicon layer such that a precision capacitor is formed between one of said regions of polycrystalline silicon, said deposited and etched oxide layer, and said N doped low resistance path.

15. The method of claim 1, further comprising the step of:

after said step of forming a transistor in said well and in said epitaxial layer, forming electrical contacts to each of said base, said collector and said emitter of each of said transistors;

depositing a layer of oxide superjacent said electrical contacts;

forming a thin film resistor superjacent said layer of oxide deposited superjacent said electrical contacts;

depositing a first layer of LTO oxide;

etching said oxide layer superjacent said electrical contacts and said first LTO oxide layer at locations superjacent at least one of said electrical contacts;

depositing a first level metal layer superjacent said first LTO oxide layer;

etching said first level metal layer at locations to provide for electrical contact to said thin film resistor and at least one of said electrical contacts;

depositing a second LTO oxide layer superjacent said first level metal layer;

etching vias into said second LTO layer at locations;

depositing a second level metal layer superjacent said second LTO oxide layer;

depositing a layer of oxide and nitride superjacent said second level metal layer; and performing an alloy step of the IC at a temperature for a time.

16. The method of claim 15, wherein said thin film resistor comprises at least one of silicon and chromium.

17. A method of forming complementary first and second transistors in a Silicon On Insulator ("SOI") for high voltage operation and having high speed and high breakdown voltage characteristics, said SOI comprising a substrate, a buried insulating layer superjacent said substrate, and a silicon device layer superjacent said buried insulating layer, said method comprising the steps of:

implanting a P doped buried conductor regions in said silicon device layer;

implanting an N doped buried conductor region in said silicon device layer;

forming an epitaxial layer superjacent said silicon device layer, said epitaxial layer having a dopant polarity;

forming an N doped low resistance path between a surface of said epitaxial layer and said implanted N doped buried conductor region;

forming a P doped low resistance path between said surface of said epitaxial layer and said implanted P doped buried conductor region;

forming a well in a portion of said epitaxial layer, said well superjacent at least one of said implanted N doped buried conductor region and said implanted P doped buried conductor region, said well having a doping polarity opposite that of said epitaxial layer;

forming a trench from said surface of said epitaxial layer down to the buried insulating layer, said trench, being disposed between said well and a remainder of said epitaxial layer, dielectrically isolating said well from said remainder of said epitaxial layer; and forming the first transistor in said well and the second transistor in said remainder of said epitaxial layer.

18. The method of claim 17, wherein said forming the first transistor in said well and the second transistor in said remainder of said epitaxial layer comprises the steps of:

implanting base regions in said well and in said remainder of said epitaxial layer of opposite polarities; and forming emitter regions enclosed by said base regions.

19. The method of claim 18, wherein said step of forming emitter regions comprises the steps of:

depositing a layer of oxide on the surface of the IC abutting said base regions;

etching said oxide layer;

depositing a layer of polycrystalline silicon superjacent said oxide layer, said layer of polycrystalline silicon having regions of dopants;

annealing the IC to diffuse said dopants in said polycrystalline silicon layer into said base regions to form emitters; and forming titanium silicide on the surface of said polycrystalline silicon layer such that a precision capacitor is formed between one of said regions of polycrystalline silicon, said deposited and etched oxide layer, and said N doped low resistance path.

20. The method of claim 17, further comprising the step of filling said trench with a first oxide, said filling said trench further comprising the steps of:

filling a portion of the space in said trench along sidewalls of said trench with a second oxide; and filling the remaining space in said trench with at least one of a third oxide and a polysilicon.

* * * * *

UNITED STATES PATENT AND TRADEMARK OFFICE
CERTIFICATE OF CORRECTION

PATENT NO. : 5,344,785
DATED : September 6, 1994
INVENTOR(S) : Rick C. Jerome et al It is certified that error appears in the above-indentified patent and that said Letters Patent is hereby corrected as shown below:

Column 2, line 41, after "CEO" insert --(e.g., 40v)--

Column 3, line 4, ".base" should read --base--

Column 5, line 16, "a-small" should read --a small--

Column 5, line 38, "in-P well" should read --in P well--

Column 6, line 56, "12" should read --212--.

Column 7, claim 1, line 56, after "layer," insert --said trench--

Column 8, claim 7, line 32, after "filling" insert --said trench--

Signed and Sealed this

Twenty-fourth Day of September, 1996

Attest:

BRUCE LEHMAN

Attesting Officer    Commissioner of Patents and Trademarks